United States Patent
Sakashita et al.

(10) Patent No.: US 9,791,533 B2
(45) Date of Patent: Oct. 17, 2017

(54) MAGNETIC RESONANCE IMAGING APPARATUS

(71) Applicant: TOSHIBA MEDICAL SYSTEMS CORPORATION, Otawara-shi (JP)

(72) Inventors: Naotaka Sakashita, Tochigi (JP); Tokunori Kimura, Tochigi (JP)

(73) Assignee: TOSHIBA MEDICAL SYSTEMS CORPORATION, Otawara-shi, Tochigi (JP)

(*) Notice: Subject to any disclaimer, the term of this patent is extended or adjusted under 35 U.S.C. 154(b) by 518 days.

(21) Appl. No.: 14/471,865

(22) Filed: Aug. 28, 2014

(65) Prior Publication Data

US 2015/0061675 A1 Mar. 5, 2015

(30) Foreign Application Priority Data

Sep. 5, 2013 (JP) ................. 2013-183958

(51) Int. Cl.
| | | |
|---|---|---|
| G01V 3/00 | (2006.01) | |
| G01R 33/563 | (2006.01) | |
| G01R 33/565 | (2006.01) | |
| G01R 33/56 | (2006.01) | |
| G01R 33/567 | (2006.01) | |

(52) U.S. Cl.
CPC .... *G01R 33/56366* (2013.01); *G01R 33/5602* (2013.01); *G01R 33/5673* (2013.01); *G01R 33/56509* (2013.01)

(58) Field of Classification Search
CPC .. A61B 5/055; G01R 33/4828; G01R 33/543; G01R 33/50; G01R 33/5608

USPC .......................................... 324/318
See application file for complete search history.

(56) References Cited

U.S. PATENT DOCUMENTS

| | | | |
|---|---|---|---|
| 6,564,080 B1 | 5/2003 | Kimura | |
| 2004/0030240 A1* | 2/2004 | Kimura | A61B 5/0263 600/420 |
| 2008/0025626 A1* | 1/2008 | Komatsu | H04N 5/23248 382/254 |
| 2009/0309592 A1* | 12/2009 | Furudate | G01F 1/56 324/306 |
| 2011/0071382 A1* | 3/2011 | Miyazaki | A61B 5/0037 600/413 |
| 2011/0074417 A1 | 3/2011 | Kitane et al. | |

(Continued)

FOREIGN PATENT DOCUMENTS

| | | |
|---|---|---|
| JP | 2011-083592 | 4/2011 |
| JP | 2011-092678 | 5/2011 |
| JP | 2011-183152 | 9/2011 |

*Primary Examiner* — Walter L Lindsay, Jr.
*Assistant Examiner* — Frederick Wenderoth
(74) *Attorney, Agent, or Firm* — Nixon & Vanderhye P.C.

(57) ABSTRACT

A magnetic resonance imaging apparatus according to an embodiment includes an execution unit and a generation unit. The execution unit executes first data collection after a predetermined inversion time elapses from a time when a labeling pulse is applied to a fluid flowing into an imaging region of a subject and a second data collection without application of the labeling pulse. The generation unit generates a differential image by using the first data and the second data. Here, the generation unit generates the differential image by a different differential method according to a relationship between the inversion time and a longitudinal relaxation time of the fluid.

20 Claims, 9 Drawing Sheets

(56) References Cited

U.S. PATENT DOCUMENTS

| | | |
|---|---|---|
| 2011/0199082 A1 | 8/2011 | Kimura |
| 2011/0245656 A1* | 10/2011 | Bammer .......... G01R 33/56366 600/411 |
| 2012/0195485 A1* | 8/2012 | Matsuba .............. A61B 5/0263 382/131 |
| 2013/0253307 A1 | 9/2013 | Miyazaki et al. |

* cited by examiner

MAGNETIC RESONANCE IMAGING APPARATUS

CROSS-REFERENCE TO RELATED APPLICATIONS

This application is based upon and claims the benefit of priority from Japanese Patent Application No. 2013-183958, filed on Sep. 5, 2013, the entire contents of all of which are incorporated herein by reference.

FIELD

Embodiments described herein generally relate to a magnetic resonance imaging apparatus.

BACKGROUND

Hitherto, there has been known a method called an arterial spin labeling (ASL) as an imaging method of imaging a fluid flowing through a subject by a magnetic resonance imaging apparatus.

Generally, in ASL, data is collected in a labeling mode of collecting data after a predetermined inversion time elapses from a time in which a labeling pulse for labeling a fluid flowing into an imaging region of a subject is applied to the subject, and data is collected in a control mode of collecting data after the same inversion time elapses from a time in which a control pulse similar to the labeling pulse is applied to a position where the fluid is not influenced. Then, a labeled image is generated from data collected in the labeling mode, a control image is generated from data collected in the control mode, and these images are differentiated, thereby generating a fluid image depicting a fluid of an imaging object.

DETAILED DESCRIPTION

A magnetic resonance imaging (MRI) apparatus according to an embodiment includes an execution unit and a generation unit. The execution unit executes first data collection after a predetermined inversion time elapses from a time in which a labeling pulse is applied to a fluid flowing into an imaging region of a subject and a second data collection without the application of the labeling pulse. The generation unit generates a differential image by using the first data and the second data. Here, the generation unit generates the differential image by a different differential method according to a relationship between the inversion time and a longitudinal relaxation time of the fluid.

Hereinafter, embodiments of the MRI apparatus will be described with reference to the accompanying drawings.

First Embodiment

Figure 1:
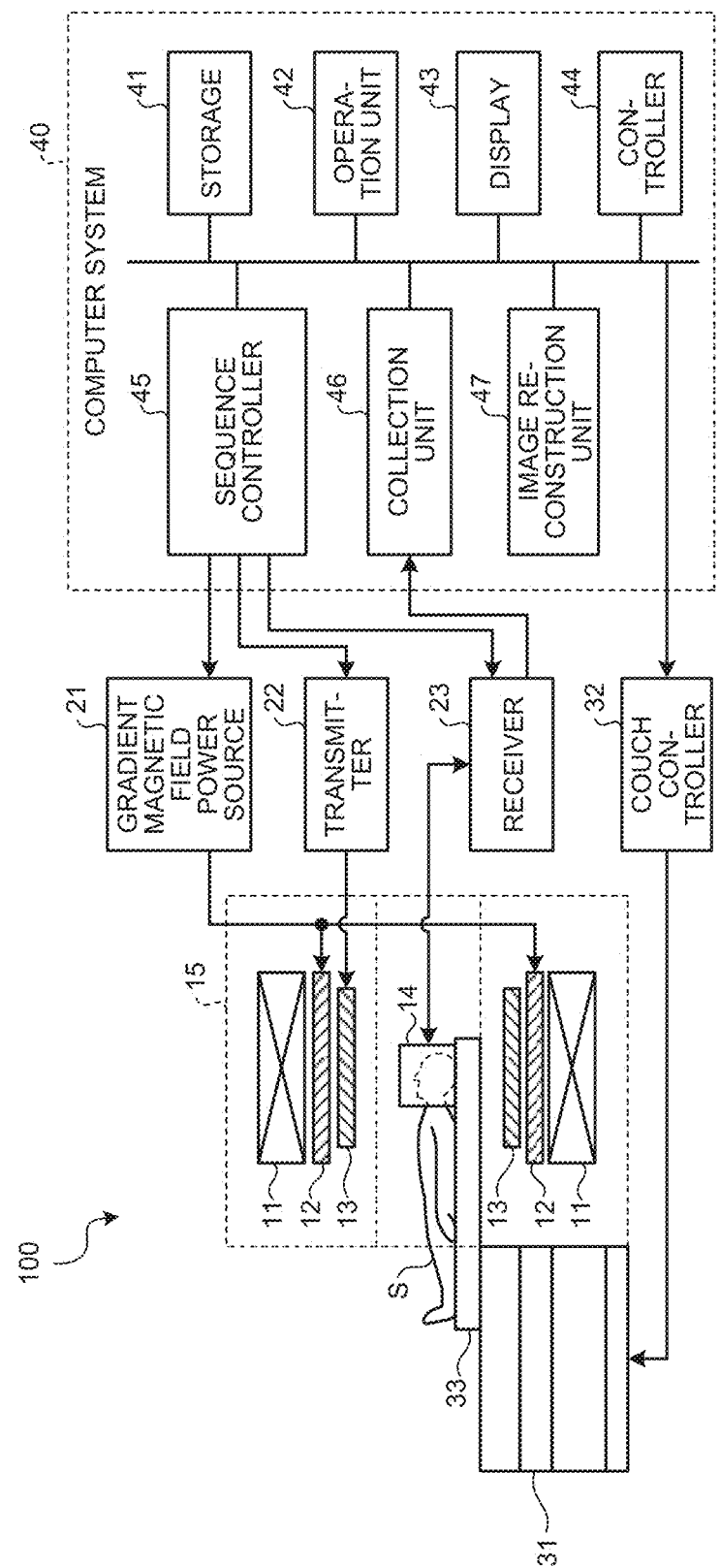
FIG. 1 is a diagram illustrating a configuration example of an MRI apparatus according to a first embodiment.

FIG. 1 is a diagram illustrating a configuration example of an MRI apparatus according to a first embodiment. As illustrated in FIG. 1, an MRI apparatus 100 includes a static magnetic field magnet 11, a gradient coil 12, a transmitting coil 13, a receiving coil 14, a gantry 15, a gradient magnetic field power source 21, a transmitter 22, and a receiver 23. Further, the MRI apparatus 100 includes a couch 31, a couch controller 32, and a computer system 40.

The static magnetic field magnet 11 is a magnet which is formed in a hollow cylindrical shape, and generates a uniform static magnetic field $B_0$ inside the cylindrical portion. For example, the static magnetic field magnet 11 is a permanent magnet or a superconducting magnet.

The gradient coil 12 is a coil which is formed in a hollow cylindrical shape, and generates a gradient magnetic field of which the magnetic field strength changes in the directions of the X, Y, and Z axes perpendicular to one another inside the cylindrical portion. Specifically, the gradient coil 12 includes three coils which generate gradient magnetic fields in the directions of the X, Y, and Z axes. These three coils individually receive a current from the gradient magnetic field power source 21, generate gradient magnetic fields in the X, Y, and Z directions as the physical directions, and synthesize the gradient magnetic fields in the directions. Accordingly, the gradient magnetic field is arbitrarily set in each of a lead-out direction, a phase encoding direction, and a slice selection direction as the logical directions perpendicular to one another.

Here, the gradient magnetic field which is set in the lead-out direction is called a lead-out gradient magnetic field Gr, and is used to change the frequency of the magnetic resonance signal according to the spatial position. Further, the gradient magnetic field which is set in the phase encoding direction is called a phase encoding gradient magnetic field Ge, and is used to change the phase of the magnetic resonance signal according to the spatial position. Further, the gradient magnetic field which is set in the slice selection direction is called a slice selecting gradient magnetic field Gs, and is used to determine an arbitrary imaging slice. The lead-out gradient magnetic field Gr, the phase encoding gradient magnetic field Ge, and the slice selecting gradient magnetic field Gs are superimposed in the static magnetic field $B_0$.

The transmitting coil 13 is a coil which is formed in a hollow cylindrical shape and is configured to receive a high-frequency current from the transmitter 22 and to apply a high-frequency pulse to a subject S disposed in a space inside the cylindrical portion. Furthermore, the transmitting coil 13 may also serve as a receiving coil which receives a magnetic resonance signal emitted from the subject S due to the influence of the high-frequency pulse.

The receiving coil 14 receives the magnetic resonance signal emitted from the subject S due to the influence of the high-frequency pulse. Further, the receiving coil 14 outputs the received magnetic resonance signal to the receiver 23. Furthermore, the receiving coil 14 illustrated in FIG. 1 is a receiving coil for a head part. However, as the receiving coil 14, for example, various receiving coils such as a receiving coil for a belly or a receiving coil for a spine are used according to an imaging part as an imaging object.

The gantry 15 supports the static magnetic field magnet 11, the gradient coil 12, and the transmitting coil 13 which are substantially formed in a cylindrical shape so that the center axes of the cylindrical portions are aligned. Specifically, the gantry 15 forms an imaging space at the inner peripheral side of the transmitting coil 13 by supporting the static magnetic field magnet 11, the gradient coil 12, and the transmitting coil 13 while the gradient coil 12 is disposed at the inner peripheral side of the static magnetic field magnet 11 and the transmitting coil 13 is disposed at the inner peripheral side of the gradient coil 12.

The gradient magnetic field power source 21 supplies a current to the gradient coil 12 according to the control by a sequence controller 45. Specifically, the gradient magnetic field power source 21 includes a high voltage generating circuit or a gradient magnetic field amplifier. The high voltage generating circuit converts an AC (Alternate Current) current supplied from a commercial AC power source into a DC (Direct Current) current of a predetermined voltage, and supplies the DC current to the gradient magnetic field amplifier. The gradient magnetic field amplifier amplifies the DC current supplied from the high voltage generating circuit, and supplies the amplified DC current to the gradient coil 12.

The transmitter 22 supplies a high-frequency current corresponding to the Larmor frequency to the transmitting coil 13 according to the control by the sequence controller 45. Specifically, the transmitter 22 includes an oscillation unit, a phase selection unit, a frequency conversion unit, an amplitude modulation unit, or a high-frequency amplifier. The oscillation unit generates an RF pulse of an original resonant frequency in a nucleus of an object within a static magnetic field. The phase selection unit selects the phase of the RF pulse generated by the oscillation unit. The frequency conversion unit converts the frequency of the high-frequency pulse output from the phase selection unit. The amplitude modulation unit modulates the amplitude of the high-frequency pulse output from the frequency conversion unit according to, for example, a sinc function. The high-frequency amplifier amplifies the high-frequency pulse output from the amplitude modulation unit, and supplies the amplified high-frequency pulse to the transmitting coil 13.

The receiver 23 generates a raw data by converting the magnetic resonance signal output from the receiving coil 14 according to the A/D (Analog-to-Digital) conversion according to the control by the sequence controller 45. Further, the receiver 23 transmits the generated raw data to a collection unit 46. Specifically, the receiver 23 includes a selector, a pre-stage amplifier, a phase sensitive detector, or an A/D converter. The selector selectively inputs the magnetic resonance signal output from the receiving coil 14. The pre-stage amplifier amplifies the magnetic resonance signal output from the selector. The phase sensitive detector detects the phase of the magnetic resonance signal output from the pre-stage amplifier. The A/D converter generates a raw data by converting an analog signal output from the phase sensitive detector into a digital signal.

The couch 31 supports the subject S when the subject S is imaged. Specifically, the couch 31 includes a couchtop 33 which places the subject S thereon and a movement mechanism which moves the couchtop 33 in the length direction, the width direction, and the vertical direction. In general, the couch 31 is provided so that the length direction of the couchtop 33 becomes parallel to the center axis of the static magnetic field magnet 11.

The couch controller 32 controls the couch 31 according to the control by the computer system 40. Specifically, the couch controller 32 drives the movement mechanism of the couch 31 so as to move the couchtop 33 in the length direction, the width direction, and the vertical direction. For example, the couch controller 32 moves the couchtop 33 having the subject S placed thereon to an imaging space formed inside the gantry 15 when the subject S is imaged.

The computer system 40 controls the entire MRI apparatus 100. Specifically, the computer system 40 includes a storage 41, an operation unit 42, a display 43, a controller 44, the sequence controller 45, the collection unit 46, and an image reconstruction unit 47.

The storage 41 stores raw data collected by the collection unit 46 or a spectrum data or image data generated by the image reconstruction unit 47 for each subject S.

The operation unit 42 receives various instructions or information items from an operator. As the operation unit 42, a pointing device such as a mouse or a track ball, a selection device such as a mode selection switch, or an input device such as a keyboard may be appropriately used.

The display 43 displays various information items such as spectrum data or image data under the control of the controller 44. As the display 43, a display device such as a liquid crystal display may be used.

The controller 44 includes a central processing unit (CPU) and a memory, and controls the entire MRI apparatus 100 by executing various programs stored in the CPU and the memory. For example, the controller 44 receives an imaging condition from the operator via the operation unit 42, and generates a sequence execution data based on the received imaging condition. Further, for example, the controller 44 receives an image display request from the operator via the operation unit 42, reads out the requested image data from the storage 41, and displays the requested image data on the display 43.

The sequence controller 45 controls the gradient magnetic field power source 21, the transmitter 22, and the receiver 23 so that a pulse sequence defined by the sequence execution data is executed based on the sequence execution data generated by the controller 44.

Here, the sequence execution data is an information item defining the pulse sequence for collecting the raw data involving with the subject S. Specifically, the sequence execution data is an information item defining the sequence for collecting the data including the intensity or the power supply timing of the power supplied from the gradient magnetic field power source 21 to the gradient coil 12, the intensity or the RF signal transmission timing of the RF signal transmitted from the transmitter 22 to the transmitting coil 13, and the detection timing of the magnetic resonance signal by the receiver 23.

The collection unit 46 collects the raw data transmitted from the receiver 23 as a result of the pulse sequence executed by the sequence controller 45. Further, the collection unit 46 stores the collected raw data in the storage 41 for each subject S.

The image reconstruction unit 47 generates a spectrum data or an image data of a desired nuclear spin inside a body of the subject S by executing a post-process, that is, a reconstruction process such as Fourier transform on the raw data stored in the storage 41. Further, the image reconstruction unit 47 stores the generated spectrum data or image data in the storage 41 for each subject S.

The configuration example of the MRI apparatus 100 according to the first embodiment has been described so far. With such a configuration, the MRI apparatus 100 has a function of imaging a fluid flowing inside the subject S by ASL.

Generally, in ASL, a data is collected in a labeling mode of collecting a data after a predetermined inversion time (hereinafter, referred to as TI) elapses from a time in which a labeling pulse for labeling a fluid flowing into an imaging region of a subject is applied to the subject, and data is collected in a control mode of collecting data after TI elapses from a time in which a control pulse similar to the labeling pulse is applied to a position where the fluid is not influenced. Here, the labeling pulse is an RF pulse of which the longitudinal magnetization becomes a negative value. For example, the labeling pulse is an RF pulse of which the flip angle is larger than 90°. As a more specific example, the labeling pulse is an inverting pulse of which the flip angle is 180°. Then, a labeled image is generated from data collected in the labeling mode, a control image is generated from data collected in the control mode, and these images are differentiated, thereby generating a fluid image depicting a fluid of an imaging object.

Here, an absolute value differential and a complex differential are known as a method of differentiating the labeled image and the control image in the related art. The absolute value differential is a method of performing a Fourier transform on each of the data collected in the labeling mode and the data collected in the control mode and differentiating an absolute value image generated therefrom. Further, the complex differential is a differentiating method other than the absolute value differential, and is, for example, a method of differentiating a data collected in a labeling mode and a data collected in a control mode as a raw data and performing a Fourier transform on a differential data obtained therefrom. Any one of these two methods may be employed depending on the vendor of the MRI apparatus.

However, the absolute value differential and the complex differential respectively have the following problems. Specifically, when data is collected in the labeling mode of ASL, the longitudinal magnetization of the fluid is reversed to become a negative value at the time when the labeling pulse is applied, and is gradually recovered to become a positive value as time goes by. For this reason, in the labeling mode, a signal value of the fluid becomes a negative value until the longitudinal magnetization of the fluid becomes zero after the application of the labeling pulse and then becomes a positive value later. Meanwhile, when a data is collected in the control mode, since the control pulse similar to the labeling pulse is applied to a position where the fluid is not influenced, the longitudinal magnetization of the fluid becomes a positive value at all times. For this reason, the signal value of the fluid becomes a positive value at all times in the control mode. That is, in ASL, the signal values of the labeled image and the control image have opposite positive and negative values until the longitudinal magnetization of the fluid becomes zero after the application of the labeling pulse. However, since the signal value is differentiated as the absolute value at all times in the absolute value differential, there is a case in which the signal value obtained by the differential does not become an appropriate value when the TI is shorter than the elapsed time (hereinafter, referred to as t (null point)) until the longitudinal magnetization of the fluid becomes zero after the application of the labeling pulse. Further, for example, when the TI is long in the complex differential, the artifact increases due to a phase error at a part such as a trunk which is easily influenced by a movement, and hence the image quality is degraded.

On the contrary, the MRI apparatus 100 according to the embodiment generates a differential image in a different differential method according to whether the TI is shorter than the t (null point) or equal to or longer than the t (null point). Specifically, the MRI apparatus 100 generates a differential image by using a complex differential when the TI is shorter than the t (null point), and generates a differential image by using an absolute value differential when the TI is equal to longer than the t (null point). Thus, according to the MRI apparatus 100 of the embodiment, since an accurate and satisfactory differential image may be obtained even at any inversion time T1, the image quality or the quantitativity of the fluid image may be improved. Hereinafter, the configuration example of the MRI apparatus 100 will be described in more detail.

Figure 2:
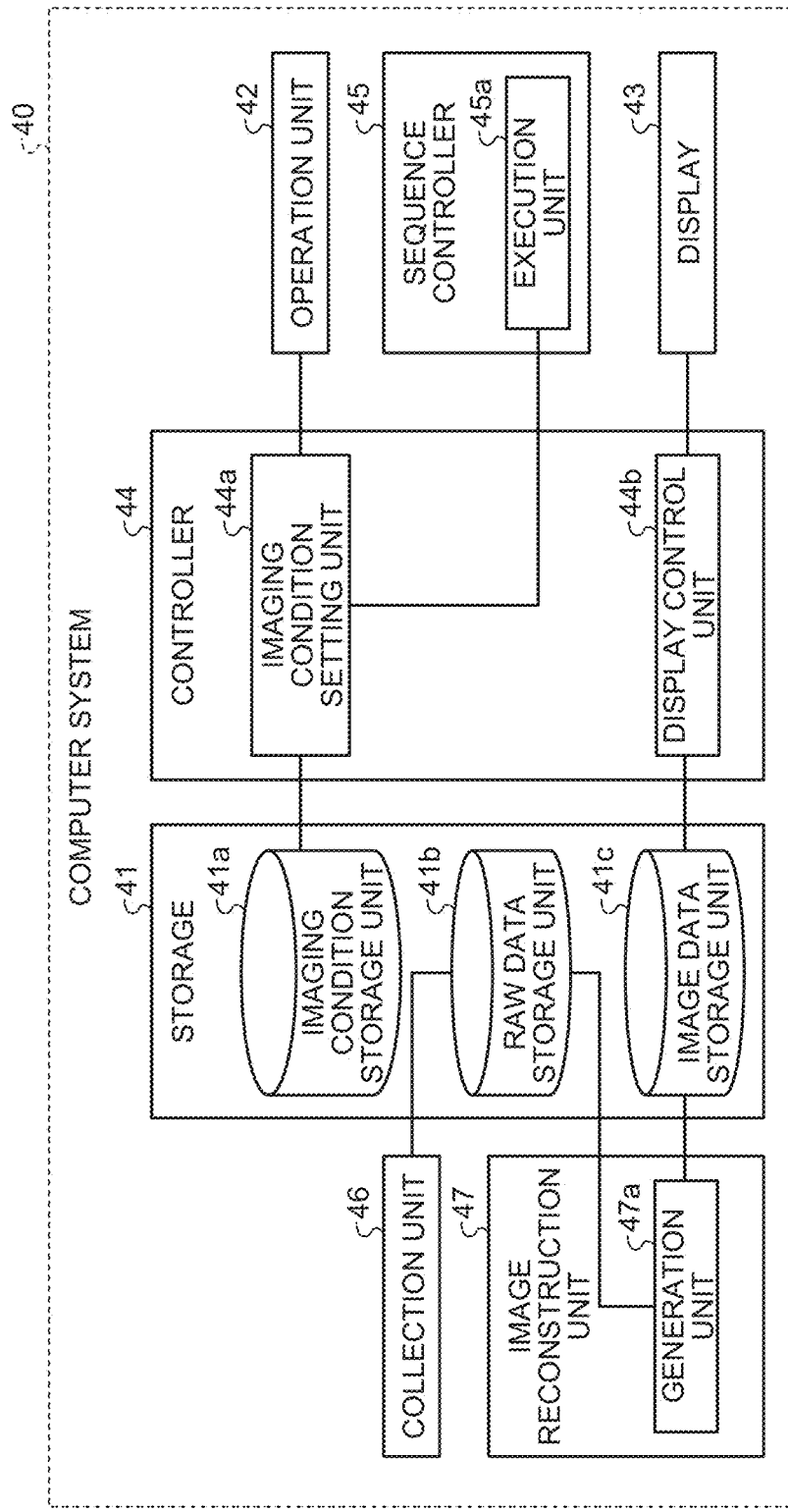
FIG. 2 is a diagram illustrating a detailed configuration example of the MRI apparatus according to the first embodiment.

FIG. 2 is a diagram illustrating a detailed configuration example of the MRI apparatus according to the first embodiment. FIG. 2 illustrates the computer system 40 illustrated in FIG. 1, and further illustrates the sequence controller 45, the collection unit 46, the image reconstruction unit 47, the storage 41, the operation unit 42, the display 43, and the controller 44 among the function units included in the computer system 40.

As illustrated in FIG. 2, the storage 41 includes an imaging condition storage unit 41a, a raw data storage unit 41b, and an image data storage unit 41c. Further, the controller 44 includes an imaging condition setting unit 44a and a display control unit 44b. Further, the sequence controller 45 includes an execution unit 45a. Further, the image reconstruction unit 47 includes a generation unit 47a.

The imaging condition storage unit 41a of the storage 41 stores an imaging condition defined for each protocol according to an imaging method and a part of an imaging object. The imaging condition mentioned herein includes, for example, a pulse sequence type or various imaging parameters necessary for executing the pulse sequence. For example, the imaging condition for the imaging process by the ASL includes an imaging parameter such as a TI or a flip angle of a labeling pulse for labeling a fluid.

The raw data storage unit 41b of the storage 41 stores the raw data collected by the collection unit 46. The image data storage unit 41c stores the image data generated by the image reconstruction unit 47. Furthermore, the raw data which is collected by the collection unit 46 may be stored as an image data in the image data storage unit 41c.

The imaging condition setting unit 44a of the controller 44 sets an imaging condition based on an instruction from the operator. Specifically, the imaging condition setting unit 44a receives a selection of a protocol from the operator via the operation unit 42. Further, the imaging condition setting unit 44a acquires an imaging condition involving with the selected protocol from the imaging condition storage unit 41a, and receives a parameter value involving with an imaging parameter included in the acquired imaging condition from the operator. Then, the imaging condition setting unit 44a generates a sequence execution data for imaging a part of the imaging object at the selected protocol based on the input parameter value.

For example, when the imaging process is executed by the ASL, the imaging condition setting unit 44a receives the TI or the flip angle of the labeling pulse for labeling the fluid. Further, the imaging condition setting unit 44a specifies the fluid of the imaging object based on the protocol selected by the operator and further specifies a value T1 of the fluid of the imaging object. For example, the value T1 of the fluid of the imaging object is stored in advance in the storage 41 for each fluid type. Then, the imaging condition setting unit 44a calculates the t (null point) based on the specified value T1.

For example, when the labeling pulse of which the flip angle is α is applied at t=0 on the assumption that the longitudinal magnetization in the parallel state is indicated by M0 and the longitudinal magnetization of the fluid immediately before the application of the labeling pulse is indicated by M, the value Mz at t=TI is expressed by the following equation (1).

$$Mz=M0+(M*(1-(1-\cos \alpha))-M0)*\exp[-TI/T1] \quad (1)$$

From the equation (1), the t (null point) as the elapsed time until Mz becomes zero after the application of the labeling pulse may be obtained by the following equation (2).

$$t \text{ (null point)}=T1*\ln((M*(1-(1-\cos \alpha))-M0)/M0) \quad (2)$$

For example, the imaging condition setting unit 44a calculates the t (null point) by the equation (2). For example, if the imaging object is blood, the t (null point) becomes about 1178 ms, for example, when T1 is set to 1700 ms, M is set to M0, and α is set to 180°.

Here, an example is described in which the imaging condition setting unit 44a specifies the fluid of the imaging object based on the protocol selected by the operator, but the method of specifying the fluid of the imaging object is not limited thereto. For example, the imaging condition setting unit 44a may display a GUI (Graphical User Interface) for selecting the fluid of the imaging object from the operator on the display 43 and specify the fluid selected via the GUI as the imaging object.

Further, an example is described in which the imaging condition setting unit 44a calculates the t (null point) based on the value T1 of the fluid of the imaging object, but the method of calculating the t (null point) is not limited thereto. For example, the imaging condition setting unit 44a may calculate the t (null point) based on a data obtained by a pre-scan. In this case, for example, the data collection of collecting a data after the TI elapses from a timing in which the labeling pulse for labeling the fluid is applied as the pre-scan is executed plural times while the TI is changed. Then, for example, the imaging condition setting unit 44a calculates the t (null point) by determining whether a signal strength of a real element subjected to a phase correction in the data collected from each of a plurality of TI has a positive or negative value.

Then, after the t (null point) is calculated, the imaging condition setting unit 44a compares the calculated t (null point) with the TI input from the operator and sets a differential mode. Specifically, the imaging condition setting unit 44a sets a different differential mode according to a state whether the TI is shorter than the t (null point) or is equal to or longer than the t (null point).

Figure 3:
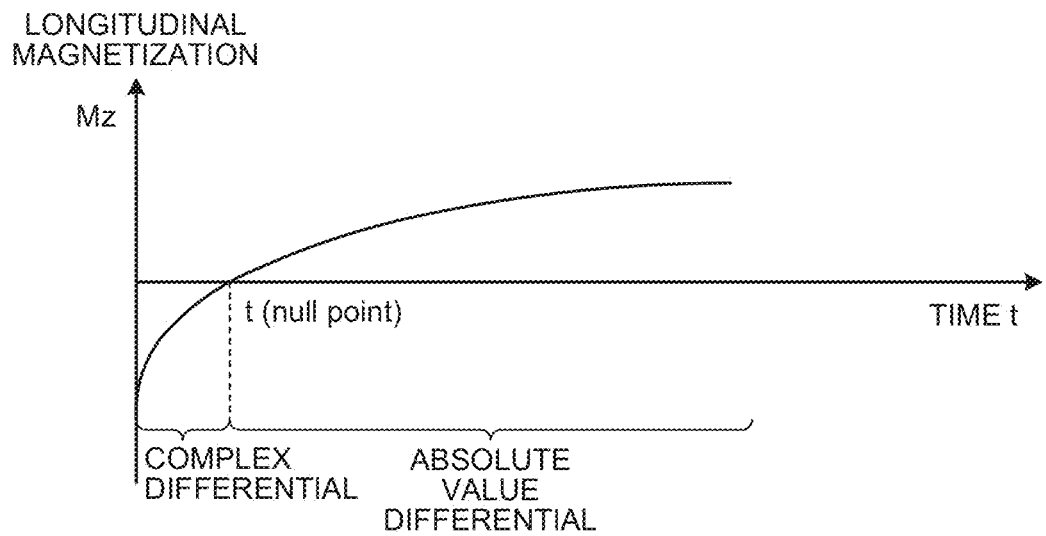
FIG. 3 is a diagram illustrating a differential mode that is set by an imaging condition setting unit according to the first embodiment.

FIG. 3 is a diagram illustrating a differential mode which is set by the imaging condition setting unit according to the first embodiment. FIG. 3 illustrates a change in the longitudinal magnetization of the fluid when the fluid is imaged by the ASL, where the horizontal axis indicates the elapse time t from the labeling pulse application timing, and the vertical axis indicates the longitudinal magnetization Mz of the fluid. For example, as illustrated in FIG. 3, the imaging condition setting unit 44a sets the differential mode as a complex differential mode when the TI is shorter than the t (null point), and sets the differential mode as an absolute value differential mode when the TI is equal to or longer than the t (null point). Here, the complex differential mode is a mode of generating the differential image by the complex differential, and the absolute value differential mode is a mode of generating the differential image by the absolute value differential.

Returning to FIG. 2, the display control unit 44b of the control unit 44 displays the fluid image generated by the generation unit 47a on the display 43. Specifically, when the fluid image is generated by the generation unit 47a, the display control unit 44b reads out the generated fluid image from the image data storage unit 41c and displays the generated fluid image on the display 43.

The execution unit 45a of the sequence controller 45 executes the pulse sequence defined by the sequence execution data by controlling the gradient magnetic field power source 21, the transmitter 22, and the receiver 23 in accordance with the sequence execution data generated by the imaging condition setting unit 44a.

For example, when the imaging process is performed by the ASL, the execution unit 45a collects a data in the labeling mode and a data in the control mode based on the sequence execution data of the ASL generated by the imaging condition setting unit 44a. Here, the labeling mode is a mode of collecting a data after the TI elapses from a timing in which the labeling pulse for labeling the fluid flowing into the imaging region of the subject S is applied to the subject. Further, the control mode is a mode of collecting a data after the same TI elapses from a timing in which the control pulse similar to the labeling pulse is applied to a position where the fluid flowing into the imaging region of the subject S is not influenced so that an MT effect caused by the labeling pulse gets balanced out. Furthermore, it is possible to differentiate the images obtained by the respective modes even when the MT effect does not get balanced out. For that reason, a data may be collected without the application of the control pulse in the control mode.

Figure 4:
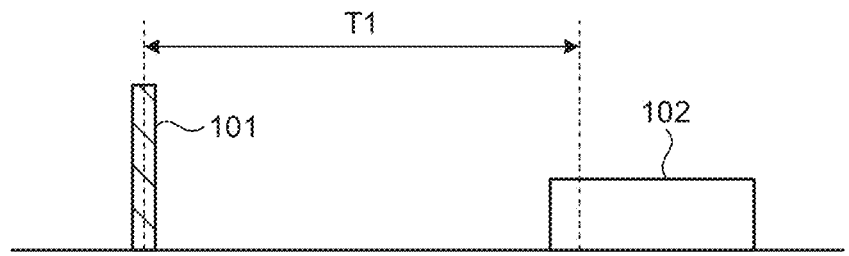
FIG. 4 is a diagram illustrating an example of a pulse sequence executed in a labeling mode of an ASL according to the first embodiment.

FIG. 4 is a diagram illustrating an example of the pulse sequence executed in the labeling mode of the ASL according to the first embodiment. For example, as illustrated in FIG. 4, in the pulse sequence executed in the labeling mode, a sequence 102 is read out and executed after the TI elapses from a timing in which a labeling pulse 101 is applied. Furthermore, there is a case where various pre-pulses such as a saturation pulse are applied before the application of the labeling pulse 101.

Here, the read sequence 102 is a data collection sequence used until the magnetic resonance signal is acquired after the application of the excitation RF pulse. For example, the read sequence may be a GRE (Gradient Echo) sequence, an SE (Spin Echo) sequence, an SSFP (Steady State Free Precession) sequence, or the like.

Figure 5:
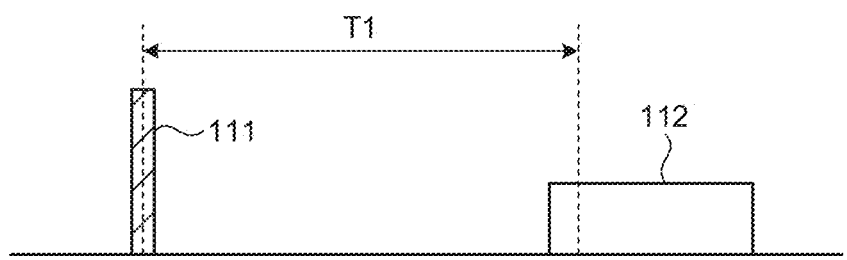
FIG. 5 is a diagram illustrating an example of a pulse sequence executed in a control mode of the ASL according to the first embodiment.

FIG. 5 is a diagram illustrating an example of the pulse sequence executed in the control mode of the ASL according to the first embodiment. For example, as illustrated in FIG. 5, in the pulse sequence executed in the control mode, a sequence 112 is read out and executed after the TI equal to the TI in the labeling mode elapses from a timing in which a control pulse 111 is applied. Furthermore, when various pre-pulses such as a saturation pulse are applied in the labeling mode, the same pre-pulse is applied even in the control mode. Further, the sequence 112 which is read out in the control mode is the same as the sequence 102 which is read out in the labeling mode.

Figure 6:
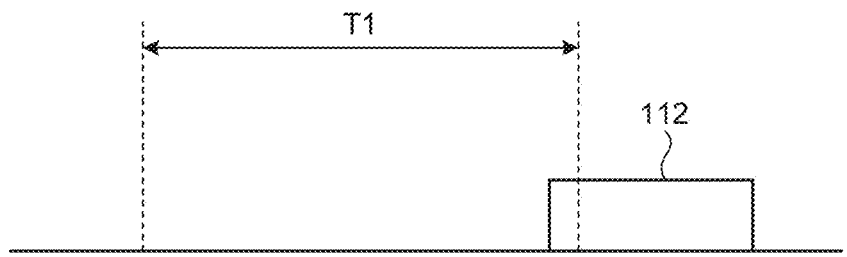
FIG. 6 is a diagram illustrating another example of the pulse sequence executed in a control mode of the ASL according to the first embodiment.

FIG. 6 is a diagram illustrating another example of the pulse sequence executed in a control mode of the ASL according to the first embodiment. For example, as illustrated in FIG. 6, in the control mode, the sequence may be read out and executed after the TI equal to the TI in the labeling mode elapses from a predetermined timing without the application of the control pulse. Here, the timing at which the read sequence is executed may be an arbitrary timing without determining the timing from the predetermined timing and the TI. For example, when various pre-pulses such as a saturation pulse are applied in the labeling mode, the sequence 112 is read out and executed after the time, which is equal to the time until the sequence is read out and executed after the pre-pulse is applied in the labeling mode, elapses from a timing in which the same pre-pulse is applied.

Furthermore, when the labeling mode and the control mode are executed plural times in order to obtain a plurality of differential images, for example, the modes are executed while being synchronized with an ECG (Electrocardiogram) signal output from an electrocardiograph attached to the subject S, a pulse wave signal output from a sphygmograph attached to the subject S, or a control signal generated periodically based on the number of clocks generated by the CPU of the controller 44. Further, when a raw data necessary to generate one image is collected plural times, the labeling mode and the control mode may be alternately executed.

The generation unit 47a of the image reconstruction unit 47 generates a fluid image depicting the fluid of the imaging object by generating a differential image using the data collected by the data collection in the labeling mode and the data collected by the data collection in the control mode. Here, the generation unit 47a generates a differential image in a different differential method according to whether the TI is shorter than the elapse time t (null point) or is equal to or longer than the elapse time t (null point).

Specifically, when the complex differential mode is set by the imaging condition setting unit 44a, that is, the TI is shorter than the t (null point), the generation unit 47a generates a differential data by differentiating the raw data collected in the labeling mode and the raw data collected in the control mode and generates a differential image by executing a Fourier transform on the generated differential data. Further, when the absolute value differential mode is set by the imaging condition setting unit 44a, that is, the TI is equal to or longer than the t (null point), the generation unit 47a generates a first absolute value image by executing a Fourier transform on the raw data collected in the labeling mode, generates a second absolute value image by executing a Fourier transform on the raw data collected in the control mode, and differentiates the absolute value images so as to generate a differential image. Then, the generation unit 47a stores the generated differential image as a fluid image in the image data storage unit 41c.

Figure 7:
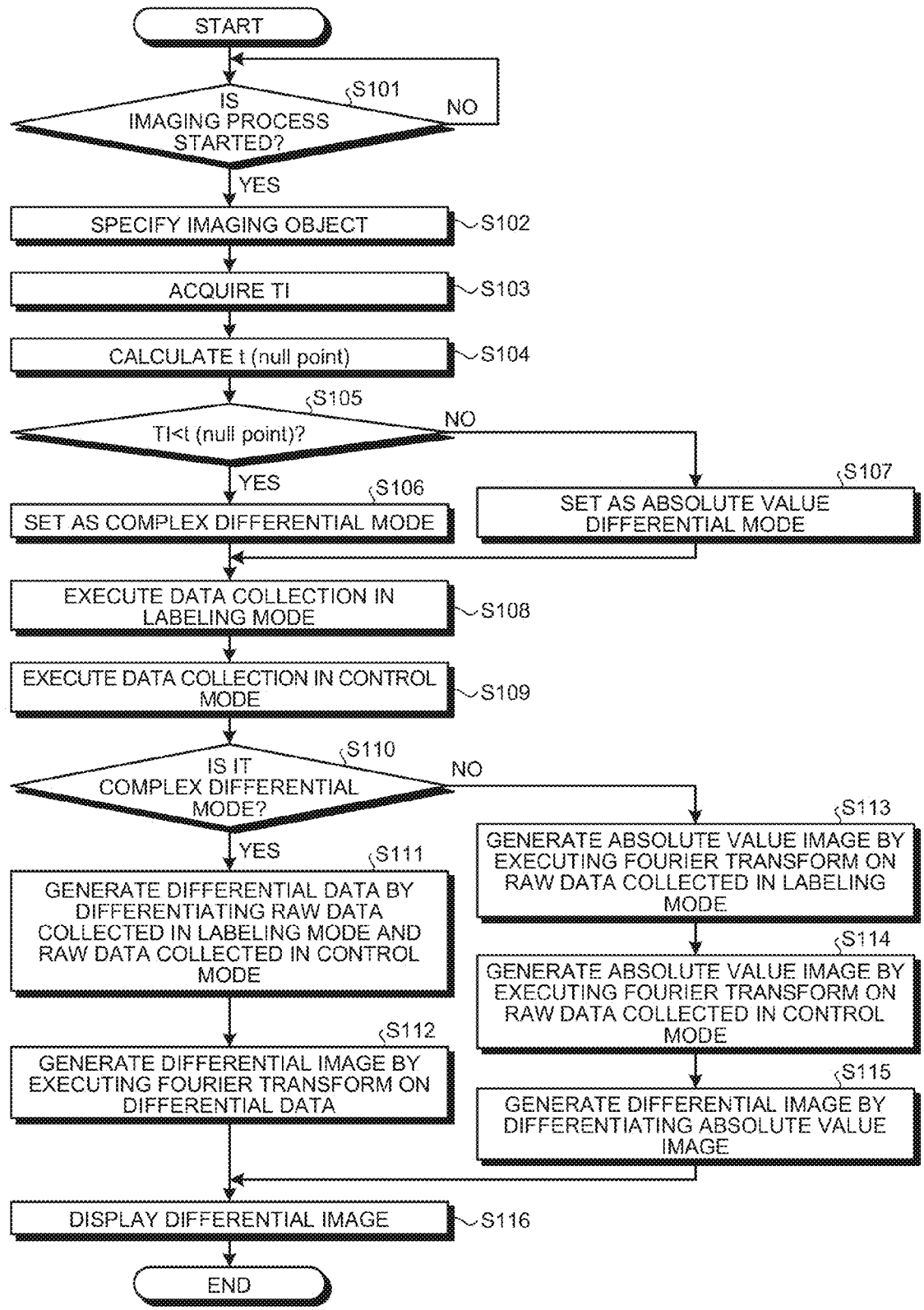
FIG. 7 is a flowchart illustrating a sequence of a fluid imaging process executed by the MRI apparatus according to the first embodiment.

FIG. 7 is a flowchart illustrating a sequence of a fluid imaging process executed by the MRI apparatus according to the first embodiment. As illustrated in FIG. 7, the MRI apparatus 100 according to the embodiment executes the following process when an instruction of starting the imaging process of the ASL is received from the operator (step S101, Yes).

First, the imaging condition setting unit 44a specifies the fluid of the imaging object (step S102), and further acquires the TI (step S103). Subsequently, the imaging condition setting unit 44a calculates the t (null point) based on the value T1 of the fluid of the imaging object (step S104), and determines whether the TI is shorter than the t (null point) or is equal to or longer than the t (null point) (step S105).

Then, when the TI is shorter than the t (null point) (step S105, Yes), the imaging condition setting unit 44a sets the differential mode as the complex differential mode (step S106). Meanwhile, when the TI is equal to or longer than the t (null point) (step S105, No), the imaging condition setting unit 44a sets the differential mode as the absolute value differential mode (step S107).

Subsequently, the execution unit 45a executes the data collection in the labeling mode (step S108), and then executes the data collection in the control mode (step S109). Furthermore, the execution unit 45a may execute the data collection in the labeling mode after the data collection in the control mode.

Subsequently, when the complex differential mode is set as the differential mode (step S110, Yes), the generation unit 47a generates a differential data by differentiating the raw data collected in the labeling mode and the raw data collected in the control mode (step S111). Subsequently, the generation unit 47a generates a differential image by executing a Fourier transform on the generated differential data (step S112).

Meanwhile, when the absolute value differential mode is set as the differential mode (step S110, No), the generation unit 47a generates a first absolute value image by executing a Fourier transform on the raw data collected in the labeling mode (step S113). Further, the generation unit 47a generates a second absolute value image by executing a Fourier transform on the raw data in the control mode (step S114). Subsequently, the generation unit 47a generates a differential image by differentiating the first absolute value image and the second absolute value image (step S115).

Subsequently, the display control unit 44b displays the differential image generated by the generation unit 47a as a fluid image on the display 43 (step S116).

In this way, in the embodiment, when the TI is shorter than the t (null point), a differential data is generated by the generation unit 47a from the raw data collected in the labeling mode and the raw data collected in the control mode, and a differential image is generated from the generated differential data. That is, in this case, the differential image is generated by the complex differential. Further, when the TI is equal to or longer than the t (null point), the first absolute value image is generated by the generation unit 47a from the raw data collected in the labeling mode, the second absolute value image is generated by the generation unit 47a from the raw data collected in the control mode, and the differential image is generated from the absolute value images. That is, in this case, the differential image is generated by the absolute value differential.

Figure 8:
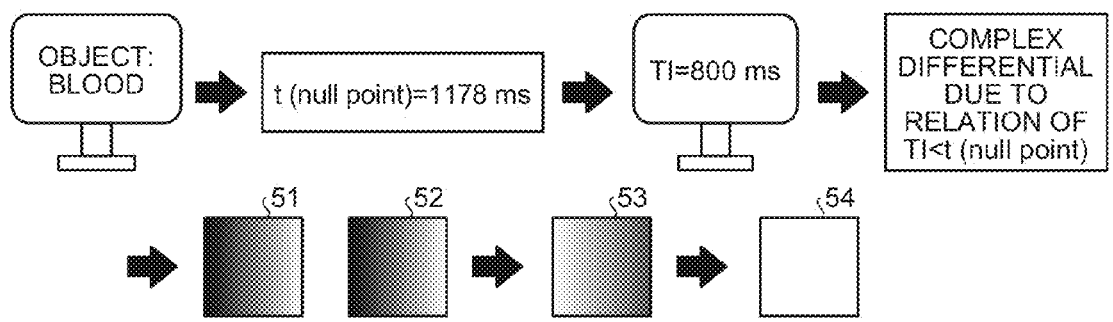
FIGS. 8 and 9 are diagrams illustrating an example of the fluid imaging process executed by the MRI apparatus according to the first embodiment.
Figure 9:
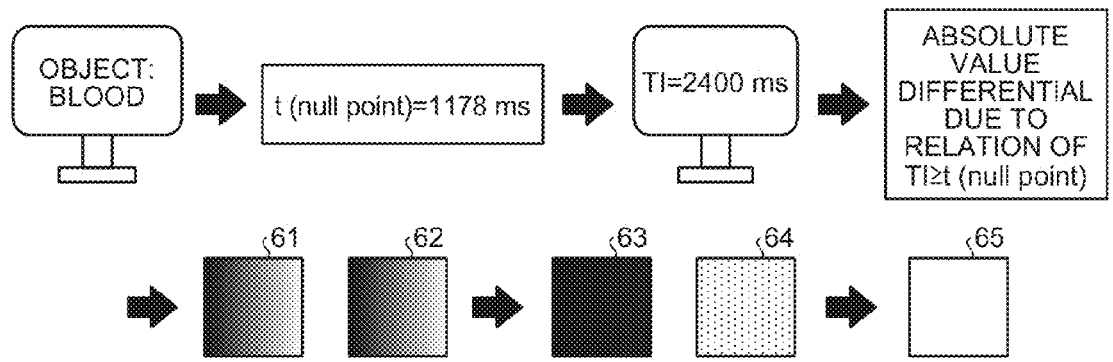

FIGS. 8 and 9 are diagrams illustrating an example of the fluid imaging process executed by the MRI apparatus according to the first embodiment. Here, an example is described in which the imaging object is blood, but the fluid of the imaging object is not limited to the blood. For example, the embodiment may be also applied to the case where a CSF (Cerebrospinal Fluid), bile, or lymph fluid is the imaging object.

As illustrated in FIG. 8, for example, when the fluid of the imaging object is blood, the imaging condition setting unit 44a calculates the t (null point) of 1178 ms. Here, for example, when the TI is 800 ms, the imaging condition setting unit 44a sets the complex differential mode as the differential mode since the relation of TI<t (null point) is established.

Then, the execution unit 45a executes the data collection in the labeling mode, and hence the collection unit 46 collects a raw data 51 (a complex data which is expressed as the complex number A+iB when A and B are set as the real number). Subsequently, the execution unit 45a executes the data collection in the control mode, and hence the collection unit 46 collects a raw data 52 (a complex data which is expressed as the complex number C+iD when C and D are set as the real number). Then, the generation unit 47a generates a differential image as a bloodstream image by differentiating the raw data 51 and the raw data 52 as the differential (the complex differential A−C+i(B−D)) so as to generate a differential data 53 and executing a Fourier transform on the differential data 53 so as to obtain an absolute value image 54 (an actual data S).

Meanwhile, for example, as illustrated in FIG. 9, when the TI is 2400 ms, the imaging condition setting unit 44a sets the absolute value differential mode as the differential mode since the relation of TI≥t (null point) is established.

Then, the execution unit 45a executes the data collection in the labeling mode. Accordingly, the collection unit 46 collects a raw data 61 (a complex data A+iB), and the generation unit 47a generates an absolute value image 63 (an actual data S1) by executing a Fourier transform on the raw data 61. Subsequently, the execution unit 45a executes the data collection in the control mode. Accordingly, the collection unit 46 collects a raw data 62 (a complex data C+iD), and the generation unit 47a generates an absolute value image 64 (an actual data S2) by executing a Fourier transform on the raw data 62. Then, the generation unit 47a generates a differential image 65 as a bloodstream image by differentiating the absolute value image 63 and the absolute value image 64 as the differential (the absolute value differential S2−S1).

Furthermore, elements (for example, fat or parenchyma organ) other than the fluid necessary at the last time, that is, a plurality of elements having different values T1 exist in a tissue of a stationary part (a background) before the differential. However, since the signal value of the stationary part is substantially the same in the image generated from the raw data collected in the labeling mode and the image generated from the raw data collected in the control mode, the stationary part disappears when these images are differentiated, and hence only the fluid element remains. For this reason, only the t (null point) based on the single T1 may be supposed.

As described above, according to the MRI apparatus 100 of the first embodiment, when the TI is shorter than the t (null point), the differential image is generated by executing a Fourier transform on the differential data obtained by differentiating the raw data. Then, when the TI is equal to or longer than the t (null point), the differential image is generated by differentiating the absolute value image obtained by executing a Fourier transform on the raw data. That is, in the first embodiment, the differential image is generated by the complex differential when the TI is shorter than the t (null point), and the differential image is generated by the absolute value differential when the TI is equal to or longer than the t (null point). Here, in the absolute value differential, the calculation is simple, and the differential error of the background tissue caused by the phase difference in accordance with the movement or the like is reduced even when the phase correction is not executed. Further, in the complex differential, the differential is correctly calculated even when the magnetization is reversed. For this reason, it is possible to obtain the accurate and satisfactory fluid image at any inversion time T1. Thus, according to the MRI apparatus 100 of the embodiment, the image quality or the quantitativity of the fluid image may be improved.

Furthermore, in the above-described first embodiment, a case has been described in which the differential image is generated by executing a Fourier transform on the differential data obtained by differentiating the raw data when the TI is shorter than the t (null point), but the differential method using the complex differential when the TI is shorter than the t (null point) is not limited thereto. Hereinafter, two modified examples of the differential method when the TI is shorter than the t (null point) will be described. Furthermore, since the differential method using the absolute value differential when the TI is equal to or longer than the t (null point) is the same as that of the first embodiment, the description thereof will not be presented herein.

First Modified Example of First Embodiment

First, a case in which a complex image is generated by executing a Fourier transform on a raw data and a differential image is generated by differentiating the generated complex image will be described as a first modified example.

Specifically, when the complex differential mode is set by the imaging condition setting unit 44a, that is, the TI is shorter than the t (null point), the generation unit 47a generates a first complex image by executing a Fourier transform on the raw data collected in the labeling mode and generates a second complex image by executing a Fourier transform on the raw data collected in the control mode. Then, the generation unit 47a generates a differential image as a bloodstream image by differentiating the first complex image and the second complex image.

Figure 10:
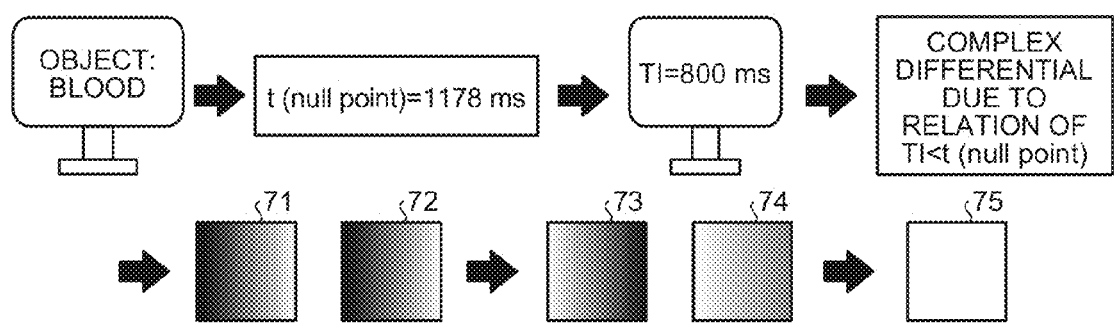
FIG. 10 is a diagram illustrating an example of a fluid imaging process according to a first modified example of the first embodiment.

FIG. 10 is a diagram illustrating an example of a fluid imaging process according to the first modified example of the first embodiment. As illustrated in FIG. 10, for example, when the fluid of the imaging object is blood, the imaging condition setting unit 44a calculates the t (null point) of 1178 ms. Here, for example, when the TI is 800 ms, the imaging condition setting unit 44a sets the complex differential mode as the differential mode since the relation of TI<t (null point) is established.

Then, the execution unit 45a executes the data collection in the labeling mode, and hence the collection unit 46 collects a raw data 71 (a complex data A+iB). Subsequently, the generation unit 47a generates a real image (R1) as an image of a real element and an imaginary image (I1) as an image of an imaginary element by executing a Fourier transform on the raw data 71, and further generates a complex image 73 (R1+iI1) from the real image and the imaginary image.

Subsequently, the execution unit 45a executes the data collection in the control mode, and hence the collection unit 46 collects a raw data 72 (a complex data C+iD). Subsequently, the generation unit 47a generates a real image (R2) as an image of a real element and an imaginary image (I2) as an image of an imaginary element by executing a Fourier transform on the raw data 72, and further generates a complex image 74 (R2+iI2) from the real image and the imaginary image.

Then, the generation unit 47a generates a differential data by differentiating the complex image 73 and the complex image 74 as the differential (R1−R2+i(I1−I2)), and generates a differential image as a bloodstream image by generating an absolute value image 75 (an actual data S). At this time, the differential image may not be essentially the absolute value image. For example, when the phase error does not exist and the correction is made, an image of which the sign is maintained may be obtained by the differential. Accordingly, when the fluid stream exists at both sides of the imaging region and the labeling pulse is applied to both sides, the direction of the fluid stream may be understood.

Second Modified Example of First Embodiment

Next, a case in which a real image is generated by executing a Fourier transform on a raw data and a differential image is generated by differentiating the generated real image will be described as a second modified example.

Specifically, when the complex differential mode is set by the imaging condition setting unit 44a, that is, the TI is shorter than the t (null point), the generation unit 47a generates a first real image by executing a Fourier transform on a raw data collected in the labeling mode and generates a second real image by executing a Fourier transform on a raw data collected in the control mode.

Furthermore, the generation unit 47a generates the first real image when the phase element in the raw data collected in the labeling mode is converted into zero, and generates the second real image when the phase element in the raw data collected in the control mode is converted into zero. Then, the generation unit 47a generates a differential image as a bloodstream image by differentiating the first real image and the second real image.

Figure 11:
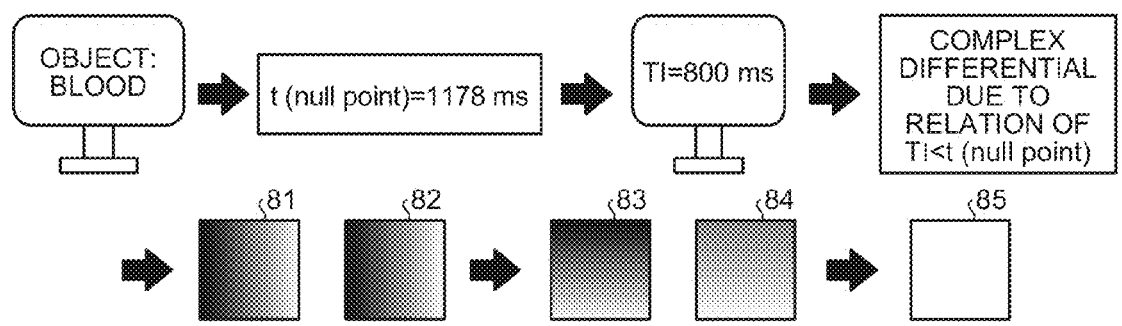
FIG. 11 is a diagram illustrating an example of a fluid imaging process according to a second modified example of the first embodiment.

FIG. 11 is a diagram illustrating an example of a fluid imaging process according to a second modified example of the first embodiment. As illustrated in FIG. 11, for example, when the fluid of the imaging object is blood, the imaging condition setting unit 44a calculates the t (null point) of 1178 ms. Here, for example, when the TI is 800 ms, the imaging condition setting unit 44a sets the complex differential mode as the differential mode since the relation of TI<t (null point) is established.

Then, the execution unit 45a executes the data collection in the labeling mode, and hence the collection unit 46 collects a raw data 81 (a complex data A+iB).

Subsequently, the generation unit 47a generates a real image 83 (R1) as an image of a real element by executing a Fourier transform on the raw data 81. Subsequently, the execution unit 45a executes the data collection in the control mode, and hence the collection unit 46 collects a raw data 82 (a complex data C+iD). Subsequently, the generation unit 47a generates a real image 84 (R2) as an image of a real element by executing a Fourier transform on the raw data 82.

Then, the generation unit 47a generates a differential image 85 as a bloodstream image by differentiating the real image 83 and the real image 84 as the differential (the real differential R1−R2).

In this way, when the real differential is executed after the phase correction, a noise bias of a part with a low SNR in the fluid image having a low SNR is reduced even when the process using the TI is not executed, and hence the SNR may be improved as a whole.

Second Embodiment

Next, a second embodiment will be described. In the above-described first embodiment, an example has been described in which the differential image is generated by the complex differential when the TI is shorter than the t (null point) and the differential image is generated by the absolute value differential when the TI is equal to or longer than the t (null point). On the contrary, in the second embodiment, a case will be described in which the differential image is generated by the addition of the absolute value when the TI is shorter than the t (null point) and the differential image is generated by the absolute value differential when the TI is equal to or longer than the t (null point).

Furthermore, the configuration of the MRI apparatus according to the second embodiment is basically the same as that of FIGS. 1 and 2, but the process executed by the imaging condition setting unit 44a and the generation unit 47a is different. Therefore, hereinafter, a process which is executed by the imaging condition setting unit 44a and the generation unit 47a according to the embodiment will be described.

Figure 12:
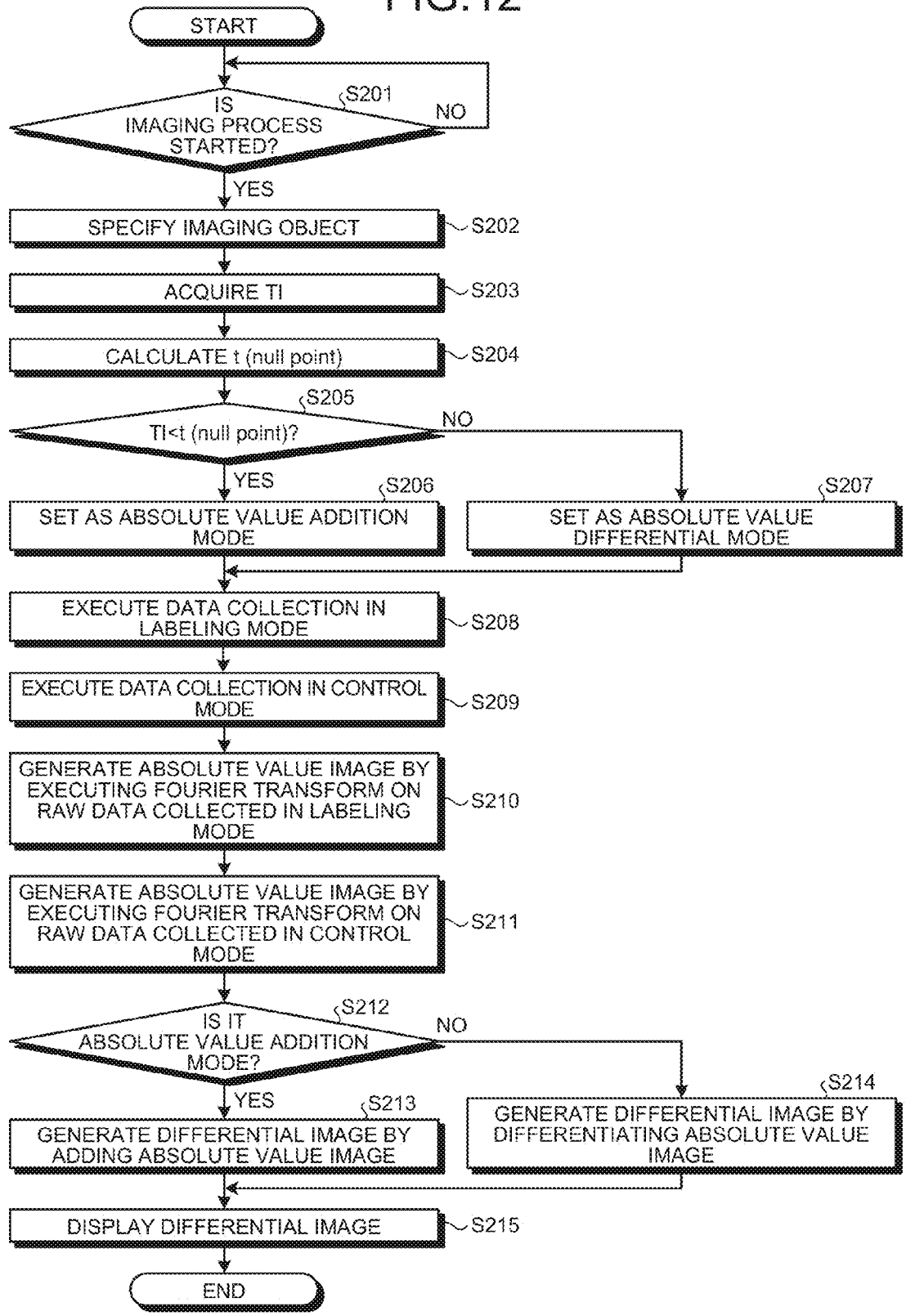
FIG. 12 is a flowchart illustrating a sequence of a fluid imaging process executed by an MRI apparatus according to a second embodiment.

FIG. 12 is a flowchart illustrating a sequence of a fluid imaging process executed by the MRI apparatus according to the second embodiment. As illustrated in FIG. 12, the MRI apparatus 100 according to the embodiment executes the following process when receiving an instruction of starting the imaging process of the ASL from an operator (step S201, Yes).

First, the imaging condition setting unit 44a specifies the fluid of the imaging object (step S202), and further acquires the TI (step S203). Subsequently, the imaging condition setting unit 44a calculates the t (null point) based on the value T1 of the fluid of the imaging object (step S204), and determines whether the TI is shorter than the t (null point) or is equal to or longer than the t (null point) (step S205).

Then, when the TI is shorter than the t (null point) (step S205, Yes), the imaging condition setting unit 44a sets the differential mode as an absolute value addition mode (step S206). Here, the absolute value addition mode is a mode of generating the differential image by adding the absolute value. Meanwhile, when the TI is equal to or longer than the t (null point) (step S205, No), the imaging condition setting unit 44a sets the differential mode as the absolute value differential mode (step S207). Here, the absolute value differential mode is a mode of generating the differential image by differentiating the absolute value.

Subsequently, the execution unit 45a executes the data collection in the labeling mode (step S208), and then executes the data collection in the control mode (step S209). Furthermore, the execution unit 45a may execute the data collection in the labeling mode after the data collection in the control mode.

Subsequently, the generation unit 47a generates a first absolute value image by executing a Fourier transform on the raw data collected in the labeling mode (step S210), and generates a second absolute value image by executing a Fourier transform on the raw data collected in the control mode (step S211).

Then, when the absolute value addition mode is set as the differential mode (step S212, Yes), the generation unit 47a generates a differential image by adding the first absolute value image and the second absolute value image (step S213). Meanwhile, when the absolute value differential mode is set as the differential mode (step S212, No), the generation unit 47a generates a differential image by differentiating the first absolute value image and the second absolute value image (step S214).

Subsequently, the display control unit 44b displays the differential image generated by the generation unit 47a as a fluid image on the display 43 (step S215).

In this way, in the embodiment, the generation unit 47a generates the first absolute value image from the raw data collected in the labeling mode and generates the second absolute value image from the raw data collected in the control mode. Then, when the TI is shorter than the t (null point), the generation unit 47a generates a differential image by adding the absolute values of the first absolute value image and the second absolute value image. Meanwhile, when the TI is equal to or longer than the t (null point), the generation unit 47a generates a differential image by differentiating the absolute values of the first absolute value image and the second absolute value image.

Figure 13:
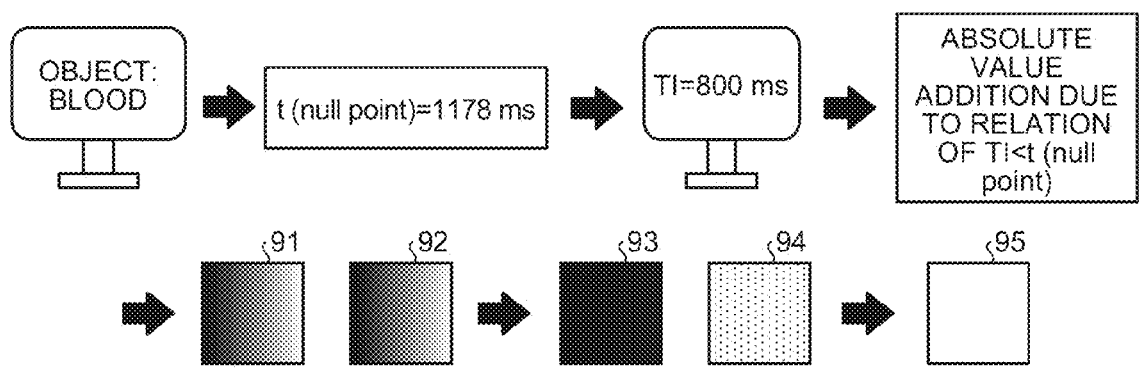
FIG. 13 is a diagram illustrating an example of the fluid imaging process executed by the MRI apparatus according to the second embodiment.

FIG. 13 is a diagram illustrating an example of the fluid imaging process executed by the MRI apparatus according to the second embodiment. Furthermore, since the differential method using the absolute value differential when the TI is equal to or longer than the t (null point) is the same as the differential method using the absolute value differential illustrated in FIG. 9, the description thereof will not be presented herein.

As illustrated in FIG. 13, for example, when the fluid of the imaging object is blood, the imaging condition setting unit 44a calculates the t (null point) of 1178 ms. Here, for example, when the TI is 800 ms, the imaging condition setting unit 44a sets the absolute value addition mode as the differential mode since the relation of TI<t (null point) is established.

Then, the execution unit 45a executes the data collection in the labeling mode. Accordingly, the collection unit 46 collects a raw data 91 (a complex data A+iB), and the generation unit 47a generates an absolute value image 93 (an actual data S1) by executing a Fourier transform on the raw data 91. Subsequently, the execution unit 45a executes the data collection in the control mode. Accordingly, the collection unit 46 collects a raw data 92 (a complex data C+iD), and the generation unit 47a generates an absolute value image 94 (an actual data S2) by executing a Fourier transform on the raw data 92.

Then, the generation unit 47a generates a differential image as a bloodstream image by reversing the sign of the sign value of the absolute value image 93 generated from the raw data 91 collected in the labeling mode and executing the differential (the absolute value differential S2−(−S1)) from the absolute value image 94 generated from the raw data 92 collected in the control mode. That is, the generation unit 47a generates a differential image 95 as a bloodstream image by adding the absolute value image 93 and the absolute value image 94 as the addition (the absolute value addition S2+S1).

Furthermore, in the method of the related art, since the signs of the signal values of the labeled image and the control image are opposite to each other in the range of TI<t (null point), an appropriate differential image may not be obtained in the absolute value differential. On the contrary, in the embodiment, in the case of TI<t (null point), the sign of the signal value of the absolute value image generated from the raw data collected in the labeling mode is reversed, and is subjected to the absolute value differential. Accordingly, an appropriate differential image may be obtained.

Further, in the second embodiment, it is desirable that the first absolute value image generated from the raw data collected in the labeling mode and the second absolute value image generated from the raw data collected in the control mode are set so that background signals are negligible or are small compared to a fluid element. For example, the second embodiment is applied to the case where a lung is imaged.

Further, as a method of reducing a background signal compared to the fluid element, there is known a method of suppressing a signal of a tissue as a background by applying a reversing pulse to an imaging region plural times. In this method, the longitudinal magnetization of the tissue as the background is reversed plural times by using the longitudinal relaxation time T1 which is different for each tissue. Accordingly, the absolute value of the longitudinal magnetization of the fluid is sufficiently large, and the data collection is executed at the timing in which the absolute value of the longitudinal magnetization of the tissue to be subjected to the suppression of the signal substantially becomes zero. Furthermore, the longitudinal magnetization of the fluid is reversed in each of the labeling mode and the control mode. However, the absolute value of the differential is not influenced by the complete reversing pulse of 180°, and is reduced only according to the TI. In the second embodiment, the more appropriate fluid image may be obtained by using both methods.

Further, the background part and the fluid part of the absolute value image are separated from each other by a mask processing, and the absolute value differential or the absolute value addition of the background part and the fluid part may be appropriately executed.

In this case, the generation unit 47a separates the background part and the fluid part by executing a mask processing on the first absolute value image and the second absolute value image. For example, the generation unit 47a sets a threshold value for separating only the signal value of the fluid part based on the image remarkably depicting the fluid part, and separates the background part and the fluid part from each other by the threshold value process.

Then, the generation unit 47a generates a differential image by differentiating the absolute value for the background part regardless of the TI and adding the absolute value for the fluid part when the TI is shorter than the t (null point) or differentiating the absolute value when the TI is equal to or longer than the t (null point). Accordingly, it is possible to obtain a fluid image from which the background signal is removed with high precision regardless of the intensity of the background signal compared to the fluid element.

Alternatively, the generation unit 47a may execute a mask processing by setting a part having a negative sign of the signal value as a blood part and setting a part having a positive sign of the signal value as a background part using an image obtained by the TI shorter than the t (null point).

Furthermore, in the above-described embodiments, an example has been described in which a data is collected by the single TI, but the embodiments may be also applied to the case where a data is collected by plural TIs. For example, the embodiments may be applied to the case where the fluid is imaged by an multi-tag/multi-TI (MT-MI) method of repeating a pattern of collecting a data after the TI elapses from a timing in which the labeling pulse for labeling the fluid is applied while changing the TI or the case where the fluid is imaged by an single-tag/multi-TI (ST-MI) method of executing the data collection in each of plural TIs after the application of the labeling pulse for labeling the image. In any method, when the differential method is changed according to whether the TI is shorter than the t (null point) or is equal to or longer than the t (null point) when the generation unit 47a generates the differential image at each TI, it is possible to improve the image quality or the quantitativity of the differential image as the fluid image.

Furthermore, in the above-described embodiments, an example has been described in which the differential method is changed according to whether the TI is shorter than the t (null point) or is equal to or longer than the t (null point, but the embodiments are not limited thereto. As described above, in the ASL, when the TI is shorter than the t (null point), the signal value does not become an appropriate value in the absolute differential, and hence it is desirable to generate the differential image by using the complex differential. Meanwhile, when the TI is equal to or longer than the t (null point), the image quality may be degraded in the case where a part which is easily influenced by the movement is imaged by the complex differential, and hence it is desirable to generate the differential image by using the absolute differential. However, for example, when the image quality does not cause a critical problem as in the case of imaging a part which is not severely influenced by the movement, the complex differential may be used even when the TI is equal to or longer than the t (null point).

Thus, for example, the timing of changing the differential method may be the timing after the t (null point). In that case, for example, the imaging condition setting unit 44a calculates the t (null point) based on the value T1 of the fluid of the imaging object and calculates the time t ($\alpha$) in which a predetermined time is added to the t (null point). Then, the imaging condition setting unit 44a changes the differential mode according to whether the TI is shorter than the time t ($\alpha$) or is equal to or longer than the time t ($\alpha$). For example, the imaging condition setting unit 44a sets the differential mode as the complex differential mode when the TI is shorter than the time t ($\alpha$) and sets the differential mode as the absolute value differential mode when the TI is equal to or longer than the time t ($\alpha$). Furthermore, as the predetermined time mentioned herein, for example, a time which is set in advance and is stored in the storage 41 may be used or a time input from the operator may be used.

Further, in the above-described embodiments, a case has been described in which the ASL is used as the method of imaging the fluid flowing through the subject, but the embodiments are not limited thereto. For example, the other imaging method may be also used as the method of imaging the fluid. For example, an imaging method called Time-SLIP (Spatial Labeling Inversion Pulse) may be also used.

The Time-SLIP is an imaging method of selectively depicting a fluid flowing into an interested region by applying a reversing pulse for reversing a longitudinal magnetization element in a leveling region set independent from an imaging region and collecting a data in the interested region after a predetermined time elapses. The predetermined time mentioned herein is called, for example, BBTI (Black Blood Time to Inversion).

Even in the imaging process using the Time-SLIP, there is case in which the differential image is generated by using a data collected by the application of the reversing pulse and a data collected without the application of the reversing pulse. In this case, since the process described in the above-described embodiments is executed, it is possible to generate a differential image in a different differential method according to the relation between the inversion time, that is, BBTI and the longitudinal relaxation time of the fluid.

Further, in the above-described embodiments, an example has been described in which the generation unit 47a of the image reconstruction unit 47 generates the fluid image by generating the differential image using the data collected in each of the labeling mode and the control mode, but the embodiments are not limited thereto. For example, the image which is finally generated by the generation unit 47a may be a calculation image which is obtained in consideration of the result obtained by the analysis of the fluid image.

According to the MRI apparatus 100 of at least one embodiment described above, the image quality or the quantitativity of the fluid image may be improved.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
execution circuitry configured to execute first data collection after a predetermined inversion time elapses from a time when a labeling pulse is applied to a fluid flowing into an imaging region of a subject and second data collection without application of the labeling pulse; and
generation circuitry configured to generate a differential image by using the first data and the second data,
wherein the generation circuitry is configured to generate the differential image by (i) a first differential method when the inversion time and a longitudinal relaxation time of the fluid have a first relationship, and (ii) a second differential method, differing from the first differential method, when the inversion time and a longitudinal relaxation time of the fluid have a second relationship differing from the first relationship.

2. The magnetic resonance imaging apparatus according to claim 1,
wherein the execution circuitry is configured to execute data collection after the inversion time elapses from a time when a control pulse similar to the labeling pulse is applied to a position where the fluid is not influenced as the second data collection.

3. The magnetic resonance imaging apparatus according to claim 1,
wherein the execution circuitry is configured to execute data collection without an application of a control pulse as the second data collection.

4. The magnetic resonance imaging apparatus according to claim 1,
wherein the generation circuitry is configured to generate the differential image in a different differential method according to whether the inversion time is shorter than the elapsed time taken until the longitudinal magnetization of the fluid becomes zero after application of the labeling pulse or is equal to or longer than the elapsed time.

5. The magnetic resonance imaging apparatus according to claim 1,
wherein the generation circuitry is configured to generate a differential data by differentiating the first data and the second data and generates the differential image by executing a Fourier transform on the generated differential data when the inversion time is shorter than the elapsed time, and wherein the generation circuitry is configured to generate a first absolute value image by executing a Fourier transform on the first data, to generate a second absolute value image by executing a Fourier transform on the second data, and generates the differential image by differentiating the first absolute value image and the second absolute value image when the inversion time is equal to or longer than the elapsed time.

6. The magnetic resonance imaging apparatus according to claim 1,
wherein the generation circuitry is configured to generate a first complex image by executing a Fourier transform on the first data, to generate a second complex image by executing a Fourier transform on the second data, and to generate the differential image by differentiating the first complex image and the second complex image when the inversion time is shorter than the elapsed time, and
wherein the generation circuitry is configured to generate a first absolute value image by executing a Fourier transform on the first data, to generate a second absolute value image by executing a Fourier transform on the second data, and to generate the differential image by differentiating the first absolute value image and the second absolute value image when the inversion time is equal to or longer than the elapsed time.

7. The magnetic resonance imaging apparatus according, to claim 1,
wherein the generation circuitry is configured to generate a first real image by executing a Fourier transform on the first data, to generate a second real image by executing a Fourier transform on the second data, and to generate the differential image by differentiating the first real image and the second real image when the inversion time is shorter than the elapsed time, and
wherein the generation circuitry is configured to generate a first absolute value image by executing a Fourier transform on the first data, to generate a second absolute value image by executing a Fourier transform on the second data, and to generate the differential image by differentiating the first absolute value image and the second absolute value image when the inversion time is equal to or longer than the elapsed time.

8. The magnetic resonance imaging apparatus according to claim 7,
wherein the generation circuitry is configured to generate the first real image by performing a phase correction for the first data, and to generate the second real image by performing a phase correction for the second data.

9. The magnetic resonance imaging apparatus according to claim 1,
wherein the generation circuitry is configured to generate a first absolute value image by executing a Fourier transform on the first data, and to generate a second absolute value image by executing a Fourier transform on the second data,
wherein the generation circuitry is configured to generate the differential image by adding the first absolute value image and the second absolute value image when the inversion time is shorter than the elapsed time, and
wherein the generation circuitry is configured to generate the differential image by differentiating the first absolute value image and the second absolute value image when the inversion time is equal to or longer than the elapsed time.

10. The magnetic resonance imaging apparatus according to claim 9,
wherein the first absolute value image and the second absolute value image are set so that background signals are negligible or are small compared to a fluid element.

11. The magnetic resonance imaging apparatus according to claim 9,
wherein the generation circuitry is configured to generate the differential image by separating a background part and a fluid part from each other by a mask processing in each of the first absolute value image and the second absolute value image, differentiating an absolute value regardless of the inversion time as for the background part, and adding an absolute value when the inversion time is shorter than the elapsed time or differentiating an absolute value when the inversion time is equal to or longer than the elapsed time as for the fluid part.

12. The magnetic resonance imaging apparatus according to claim 1, further comprising:
setting circuitry configured to calculate a time until the longitudinal magnetization of the fluid becomes zero after the application of the labeling pulse based on a value T1 of a fluid of an imaging object,
wherein the generation circuitry is configured to use the time calculated by the setting circuitry as the elapsed time.

13. The magnetic resonance imaging apparatus according to claim 12, further comprising:
setting circuitry configured to calculate a time until the longitudinal magnetization of the fluid becomes zero after the application of the labeling pulse based on a data obtained by a pre-scan of executing plural times the data collection of collecting the data after the predetermined inversion time elapses from a timing in which the labeling pulse is applied while changing the inversion time,
wherein the generation circuitry is configured to use the time calculated by the setting circuitry as the elapsed time.

14. A magnetic resonance imaging (MRI) method comprising:
using an MRI system to effect
collecting first MRI data after a predetermined inversion time elapses from a time when a labeling pulse is applied to a fluid flowing into an imaging region of a subject and collecting second MRI data without application of the labeling pulse; and
generating a differential image by using the first MRI data and the second MRI data,
wherein the differential image is generated by (i) a first differential method when the inversion time and a longitudinal relaxation time of the fluid have a first relationship, and (ii) a second differential method, differing from the first differential method, when the inversion time and a longitudinal relaxation time of the fluid have a second relationship differing from the first relationship.

15. The magnetic resonance imaging method according to claim 14,
wherein the second MRI data is collected after the inversion time elapses from a time when a control pulse similar to the labeling pulse is applied to a position where the fluid is not influenced.

16. The magnetic resonance imaging method according to claim 14,
wherein the second MRI data is collected without application of a control pulse.

17. The magnetic resonance imaging method according to claim 14, wherein the differential image is generated using a different differential method according to whether the inversion time is shorter than the elapsed time taken until the longitudinal magnetization of the fluid becomes zero after application of the labeling pulse or is equal to or longer than the elapsed time.

18. The magnetic resonance imaging method according to claim 14, wherein differential data is generated by differentiating the first MRI data and the second MRI data and the differential image is generated by executing a Fourier transform on the generated differential data when the inversion time is shorter than the elapsed time, and wherein a first absolute value image is generated by executing a Fourier transform on the first MRI data, a second absolute value image is generated by executing a Fourier transform on the second MRI data, and the differential image is generated by differentiating the first absolute value image and the second absolute value image when the inversion time is equal to or longer than the elapsed time.

19. The magnetic resonance imaging method according to claim 14, wherein a first complex image is generated by executing a Fourier transform on the first MRI data, a second complex image is generated by executing a Fourier transform on the second MRI data, and the differential image is generated by differentiating the first complex image and the second complex image when the inversion time is shorter than the elapsed time, and wherein a first absolute value image is generated by executing a Fourier transform on the first MRI data, a second absolute value image is generated by executing a Fourier transform on the second MRI data, and the differential image is generated by differentiating the first absolute value image and the second absolute value image when the inversion time is equal to or longer than the elapsed time.

20. The magnetic resonance imaging method according to claim 14, wherein a first real image is generated by executing a Fourier transform on the first MRI data, a second real image is generated by executing a Fourier transform on the second MRI data, and the differential image is generated by differentiating the first real image and the second real image when the inversion time is shorter than the elapsed time, and wherein a first absolute value image is generated by executing a Fourier transform on the first MRI data, a second absolute value image is generated by executing a Fourier transform on the second MRI data, and the differential image is generated by differentiating the first absolute value image and the second absolute value image when the inversion time is equal to or longer than the elapsed time.

* * * * *